United States Patent
Zhou et al.

(10) Patent No.: US 11,910,521 B2
(45) Date of Patent: Feb. 20, 2024

(54) POWER DEVICE ASSEMBLIES HAVING EMBEDDED PCBS AND ENHANCED COOLING AND METHODS OF FABRICATING THE SAME

(71) Applicant: Toyota Motor Engineering & Manufacturing North America, Inc., Plano, TX (US)

(72) Inventors: Feng Zhou, Ann Arbor, MI (US); Ercan Dede, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 33 days.

(21) Appl. No.: 17/699,389

(22) Filed: Mar. 21, 2022

(65) Prior Publication Data
US 2023/0300972 A1 Sep. 21, 2023

(51) Int. Cl.
*H05K 1/02* (2006.01)
*H05K 3/46* (2006.01)

(52) U.S. Cl.
CPC ......... *H05K 1/0209* (2013.01); *H05K 1/0272* (2013.01); *H05K 3/4697* (2013.01); *H05K 2201/10015* (2013.01)

(58) Field of Classification Search
CPC .. H05K 1/0203; H05K 1/0204; H05K 1/0206; H05K 1/0209
See application file for complete search history.

(56) References Cited

U.S. PATENT DOCUMENTS

| | | | |
|---|---|---|---|
| 10,888,036 B1 | 1/2021 | Joshi et al. | |
| 10,945,333 B1 | 3/2021 | Joshi et al. | |
| 2021/0194323 A1 | 6/2021 | Joshi et al. | |
| 2022/0322582 A1* | 10/2022 | Fujioka | H05K 1/0206 |

FOREIGN PATENT DOCUMENTS

| | | |
|---|---|---|
| CN | 106994343 B | 9/2019 |
| CN | 209794568 U | 12/2019 |
| CN | 210609833 U | 5/2020 |

* cited by examiner

*Primary Examiner* — Jeremy C Norris
(74) *Attorney, Agent, or Firm* — DINSMORE & SHOHL LLP (57) ABSTRACT

Disclosed herein are apparatus and methods for a power electronics assembly that includes a printed circuit board (PCB) and an electrical insulation portion. The PCB includes a plurality of embedded power devices and a substrate layer having a plurality of metal inverse opal (MIO) portions. The electrically insulating portion is positioned between each of the MIO portions. The plurality of MIO portions is thermally coupled to the plurality of embedded power devices.

20 Claims, 7 Drawing Sheets

POWER DEVICE ASSEMBLIES HAVING EMBEDDED PCBS AND ENHANCED COOLING AND METHODS OF FABRICATING THE SAME

TECHNICAL FIELD

The present specification generally relates to apparatus and methods for power electronic assemblies and, more specifically, apparatus and methods for power electronic assemblies having reduced thermal resistance and improved cooling.

BACKGROUND

Due to the increased use of electronics in vehicles, there is a need to make electronic systems more compact. One of the components of these electronic systems are power device-embedded printed circuit boards (PCBs). Power device-embedded PCBs define large cooling requirements due to the heat generated by the power devices.

Additionally, there has been a trend for PCB components conventionally composed of silicon to now be composed of silicon-carbide. The use of silicon-carbide causes a larger heat flux due to it defining a smaller device footprint. For these reasons, and more, there is a need to improve the cooling of power device-embedded PCBs while maintaining a compact package size.

SUMMARY

In one embodiment, apparatus for a power electronics assembly includes a printed circuit board (PCB). The PCB includes a plurality of embedded power devices, a substrate layer having a plurality of metal inverse opal (MIO) portions, and an electrically insulation portion. The electrically insulating portion is positioned between each of the MIO portions. The plurality of MIO portions is thermally coupled to the plurality of embedded power devices.

In another embodiment, methods for fabricating a power electronics assembly include forming an electrically insulation layer on a substrate layer of a printed circuit board (PCB), where the electrically insulation layer defines a plurality of cavities. The methods further include depositing a metal inverse material (MIO) template into each of the plurality of cavities. The methods further include depositing MIO material into each of the MIO templates. The methods further include removing the MIO templates, thereby forming a plurality of MIO portions, each being thermally coupled to an embedded device of a plurality of embedded devices of the PCB.

In yet another embodiment, methods for fabricating a power electronics assembly include forming an electrical insulation layer having a plurality of cavities onto a printed circuit board (PCB). The methods further include placing a frame onto the PCB. The methods further include depositing a metal inverse material (MIO) template into each of the plurality of cavities. The methods further include depositing MIO material into the MIO template. The methods further include removing the frame and the MIO template, thereby forming a plurality of MIO portions, each being thermally coupled to an embedded device of a plurality of embedded devices of the PCB.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to a power electronics assemblies that include a printed circuit board (PCB) having a plurality of embedded power devices, as well as a cold plate in contact with the PCB. The PCB may include a plurality of metal inverse opal (MIO) portions that are thermally coupled to the plurality of embedded power devices. The MIO portions may provide improved cooling of the plurality of embedded power devices. This may result in an increased power output of the plurality of embedded power devices and an improved power density of the power electronics assemblies. The power electronic assemblies may include a cold plate coupled to the PCB. The PCB may include pin fins to improve the cooling rate of the power electronics assemblies. The pin fins may be coated with MIO to further improve the cooling rate of the power electronics assemblies.

The cold plate may receive dielectric coolant to electrically insulate each of the plurality of MIO portions, thereby avoiding or minimizing the need for electrical insulation layers and/or reduce overall thermal resistance. Due to the decreased thermal resistance, the cooling process is more efficient, thereby allowing for the cold plate to be thinner, which results in an overall compact package size that offers improved cooling capabilities. In embodiments, the power electronics assemblies described herein can be integrated into other cooling systems that also utilize dielectric coolants, such as a motor cooling system (e.g., in-wheel motor) or the like.

Various embodiments of the power electronics assemblies and methods of fabricating the same are described in more detail herein. Whenever possible, the same reference numerals will be used throughout the drawings to refer to the same or like parts.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

Due to the limited cooling capabilities in traditional power device embedded PCB configurations, the configurations may delimit the power output of their power devices or increase the size of the cold plate. This results in, respectively, additional configurations being used to meet a desired power output or large package sizes. Further, traditional power device embedded PCB configurations may need electric insulation layers between the PCB and the cold plate in order to electrically isolate power devices of varying voltages from each other. When using electric insulation layers, thermal insulation material (TIM) may also be used on one or more sides of the electric insulation layer to enhance the cooling rate from the PCB to the cold plate. The addition of electric insulation layers and TIM layers can result in increased total thermal resistance of the PCB. Due to the high heat flux from power devices and poor heat spreading within the PCB and in increased total thermal resistance due to the additional layers, traditional power electronic assemblies suffer from inferior cooling capabilities. The power electronics assembly may output a lower power output due to the inferior cooling capacity to cool the power devices and add to the package size of the power electronics assembly configuration, which limits the locations in which the power electronics assembly may be installed (e.g., only certain locations within a vehicle).

Each structure shown and described herein provides advantages over conventional structures (e.g., power electronics assemblies) due to the compact package size, increased heat spreading, decreased thermal resistance, and better flow distribution, which all result in a higher cooling capacity. In addition, the structures shown and described herein may also be deployable in non-traditional spaces and/or be integrated with existing components.

Figure 1:
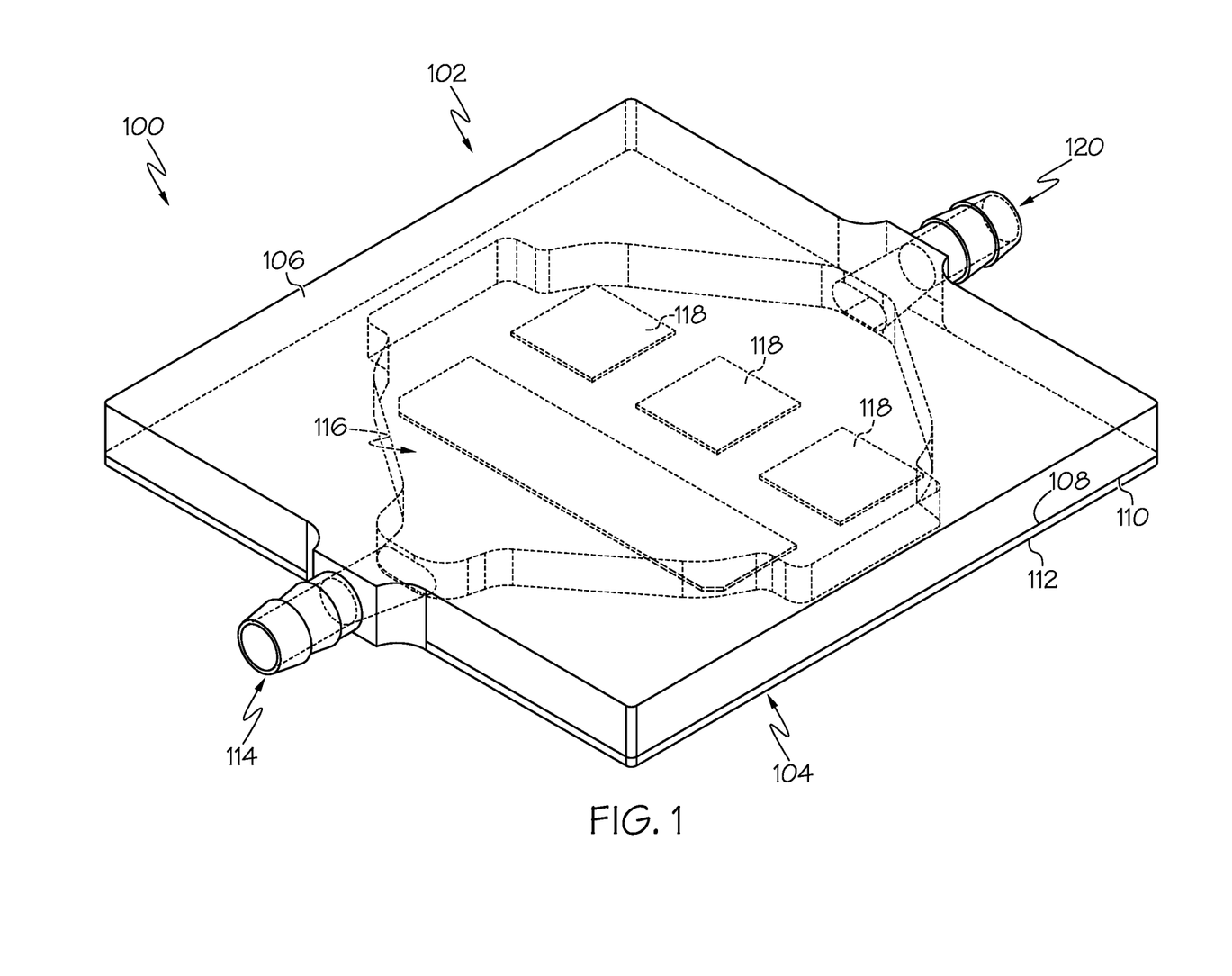
FIG. 1 schematically depicts a perspective view of a power electronics assembly, according to one or more embodiments shown and described herein.

Referring now to FIG. 1, an embodiment of a power electronics assembly 100 providing a lower volume profile, improved heat spreading, increased power density, and lower electrical inductance is generally depicted. In some embodiments, the power electronics assembly 100 is utilized in an electric vehicle, such as, for example, integrated with a motor cooling system of an electric vehicle. In other embodiments, the power electronics assembly 100 is used in an electrically-driven power device, such as, for example, a hybrid vehicle, any electric motor, generators, industrial tools, household appliances, or any other electrically-drive power device requiring a compact package size. The power electronics assembly 100 may generally include a multi-layer printed circuit board (PCB) 104 and a cold plate 102. The cold plate 102 may have a first surface 106 and a second surface 108 opposite and parallel to the first surface 106.

The PCB 104 may have a first PCB surface 110 and a second PCB surface 112 opposite and parallel to the first PCB surface 110. Mounted to the first PCB surface and/or second PCB surface 110, 112 of the PCB 104 may be one or more of passive components and/or electrical components, such as logic circuits (not shown). The one or more passive components and/or electrical components may include one or more resistors, capacitors, inductors, diodes, oscillators, transistors, integrated circuits, switches, terminals, or the like. The first PCB surface 110 or the second PCB surface 112 may also include one or more terminals for connection to one or more devices as will be described in greater detail herein.

When the power electronics assembly 100 is assembled, the first PCB surface 110 is in contact with (e.g., coupled to) the second surface 108 of the cold plate 102. As depicted, each of the first PCB surface 110 and the second surface 108 are substantially flat (e.g., planar). However, the first PCB surface 110 and the second surface 108 may be profiled in any manner to enhance mating between the two surfaces. For example, the first PCB surface 110 may include a boss that is received by an aperture of the second surface 108.

In embodiments, a second PCB or a capacitor pack (not shown) may be coupled to the first surface 106 of the cold plate 102. In these embodiments, the cold plate 102 provides double sided cooling to both the PCB 104 and the second PCB or the capacitor pack. This is due to the enhanced cooling capabilities of the power electronics assembly 100 as described in greater detail herein.

The cold plate 102 includes an inlet 114 and an outlet 120. The inlet 114 is configured to receive coolant from a cooling system (not shown). After entering the inlet 114, the coolant interfaces with the cold plate 102 in order to receive heat from the cold plate 102. The warmed coolant may then exit the cold plate 102 via the outlet 120. In this way, the cold plate 102 is able to cool the power electronics assembly 100. In embodiments, the inlet 114 and the outlet 120 are positioned on opposing sidewalls of the cold plate 102. In embodiments, the inlet 114 and the outlet 120 are positioned on the same sidewalls or adjacent sidewalls of the cold plate 102.

Figure 2A:
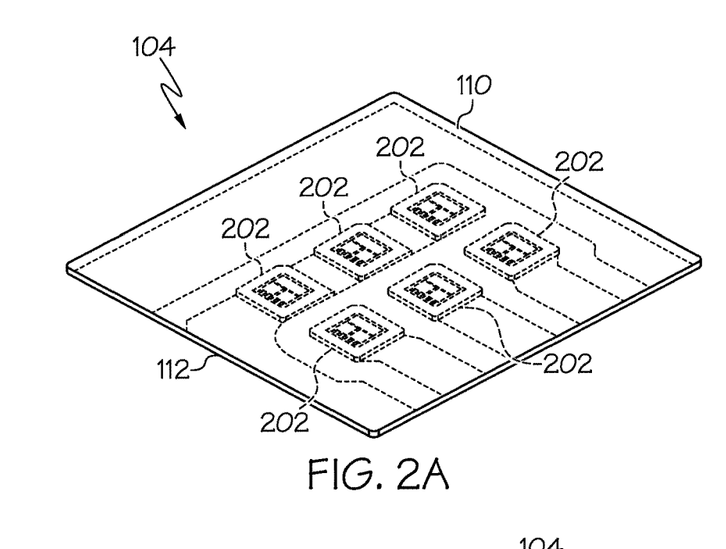
FIG. 2A schematically depicts a first view of a Printed Circuit Board (PCB), according to one or more embodiments shown and described herein.
Figure 2B:
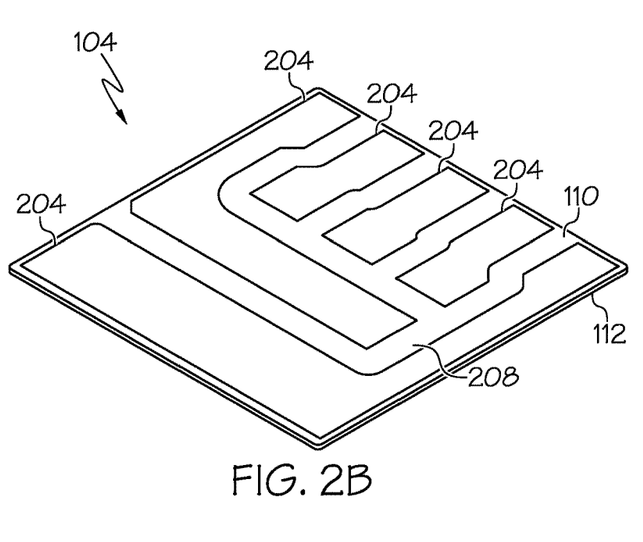
FIG. 2B schematically depicts a second view of a PCB, according to one or more embodiments shown and described herein.
Figure 2C:
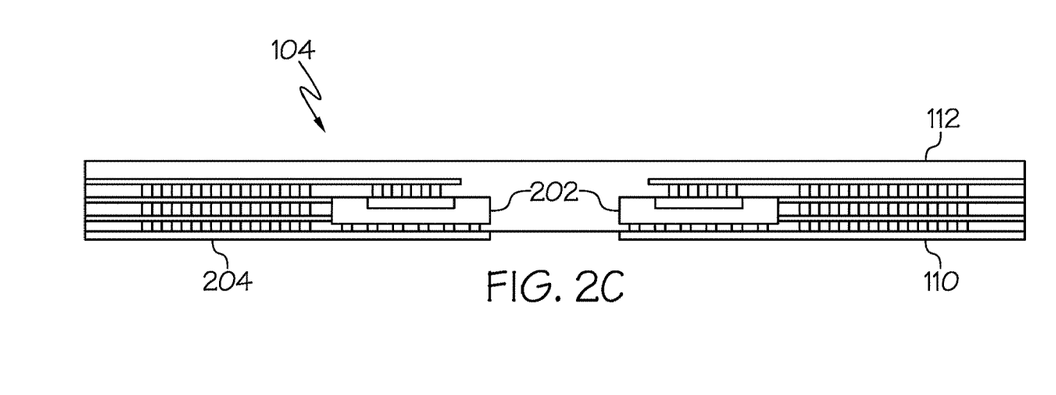
FIG. 2C schematically depicts a cross-sectional, side view of a PCB, according to one or more embodiments shown and described herein.

Referring now to FIGS. 1-2C, the PCB 104 includes a plurality of metal inverse opal (MIO) portions 118, a plurality of embedded power devices 202, and a plurality of conductive layers 204. The plurality of embedded power devices 202 described herein may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the plurality of embedded power devices 202 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module.

The plurality of conductive layers 204 are positioned on and within the first PCB surface 110 and provides both electrical conduction to and from the plurality of embedded power devices 202 and thermal conductive between the plurality of embedded power devices 202 and the cold plate 102. Each of the plurality of conductive layers 204 may also have a particular voltage correlating to their respective power device. An insulation layer 208 on the first PCB surface 110 may electrically insulate each of the plurality of conductive layers 204 from each other. Referring to FIG. 2C, various conductive layer architectures are illustrated thermally and electrically coupling the plurality of embedded power devices 202 to the plurality of conductive layers 204.

Referring back to FIG. 1, the plurality of MIO portions 118 extend from the first PCB surface 110 and towards the cold plate 102. Further, the plurality of MIO portions 118 extend into the manifold 116 so that the plurality of MIO portions may be in contact with coolant in the manifold 116. The plurality of MIO portions 118 may be formed onto the plurality of conductive layers 204 or formed adjacent to the plurality of conductive layers 204. The plurality of MIO portions 118 are thermally coupled to a plurality of embedded power devices 202 via the plurality of conductive layers 204. Accordingly, the plurality of MIO portions 118 remove heat from the plurality of embedded power devices 202 via the plurality of conductive layers 204. The plurality of MIO portions 118 are porous and provide high capillary pressure for efficient cooling. The plurality of MIO portions 118 provide increased surface area to engage with a cooling fluid within the manifold 116 to facilitate heat transfer from a plurality of embedded power devices 202 to the cooling fluid to cool the plurality of embedded power devices 202. For example, the plurality of MIO portions 118 may include a plurality of networked pores and/or cavities, which operate as nucleation sites. The networked pores may extend throughout the MIO structure of each of the plurality of MIO portions 118, such that cooling fluid can flow through the networked pores and allow heat to be exchanged between the plurality of MIO portions 118 and the cooling fluid. Without intending to be limited by theory, the geometry of the plurality of networked pores may assist in nucleation of the cooling fluid, further assisting in transferring thermal energy from the plurality of MIO portions 118 and removing heat from the plurality of embedded power devices 202.

The plurality of MIO portions 118 may be formed in a variety of ways. For example, the plurality of MIO portions 118 may be formed by depositing metal within a sacrificial template. The sacrificial template may include, for example and not as a limitation, microspheres that are dissolved after metal deposition to leave a skeletal network of metal with a periodic arrangement of networked pores, which may or may not be etched to increase porosity and interconnection of the hollow spheres. In some embodiments, the sacrificial template may include a photoresist layer that is partially ablated with one or more lasers (e.g., holographic lithography using two or more intersecting lasers, three or more intersecting lasers, four or more intersecting lasers) to create a pattern of networked pores, which may then be electroplated. The photoresist layer may thereafter be dissolved or burned off through application of heat, leaving the skeletal network. The plurality of MIO portions 118 may be formed of any suitable metal or metal alloy, polymer, semiconductor, and may be for example, a copper inverse opal (CIO) structure, a nickel inverse opal (NIO) structure, and/or the like.

Conventional manifolds for cold plates are composed of electrically conductive materials, such as metal or the like. Accordingly, an electrical insulation layer may be disposed between the cold plate and the PCB to prevent power devices of the PCB with varying voltages from electrically shorting. Further, TIM layers may be applied on both sides of the electrical insulation layer to increase the heat flux from the PCB to the manifold. These additional layers result in increased thermal resistance and increased package size of the power electronics assembly.

The cold plate 102 of the present disclosure includes a manifold 116. In some embodiments, the manifold 116 is coated with an electrically insulating material. The electrically insulating material electrically isolates the plurality of MIO portions 118 from each other, thereby removing a need for an electrical insulation layer and TIM layers on both sides of the electrically insulating material. The cold plate 102 may be formed through casting, 3D printing, machining, or the like. In some embodiments, a single TIM layer (e.g., such as grease) is placed between the PCB 104 and the cold plate 102.

Due to the decreased thermal resistance in the power electronics assembly 100 and by directly placing the PCB 104 in contact with the cold plate 102, the cooling capacity of the cold plate 102 is increased. Accordingly, the thickness of the cold plate 102 (e.g., a distance from the first surface 106 to the second surface 108) may be decreased. In some embodiments, the cold plate 102 has a thickness of about 5 mm to about 10 mm. In some embodiments, the cold plate 102 has a thickness of about 8 mm to about 12 mm. In some embodiments, the cold plate 102 has a thickness of about 9 mm to about 15 mm. The decreased thickness of the cold plate 102 results in the power electronics assembly 100 having a smaller package size and a more efficient thermal design as compared to conventional designs. Further, the power output of the plurality of power embedded devices 202 may be increased due to the increased cooling capacity.

Figure 3A:
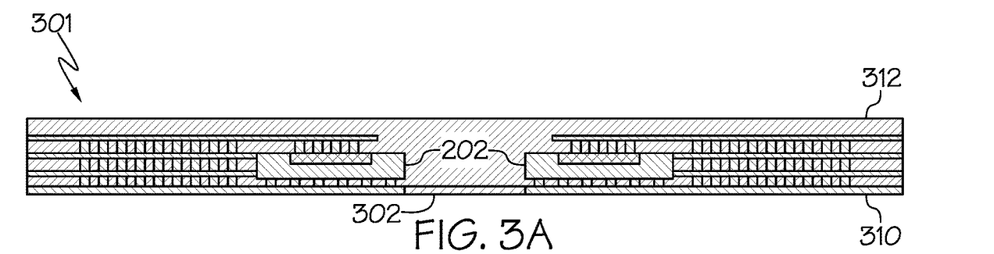
FIGS. 3A-3E schematically depicts a cross-sectional, side view of a power electronics assembly being fabricated by a method, according to one or more embodiments shown and described herein.

Referring now to FIGS. 3A-3E, a method of fabricating the power electronics assembly 100 is illustrated, according to varying embodiments. FIG. 3A illustrates a side, cross-sectional view of a PCB 301 having the plurality of embedded power devices 202 embedded between a first PCB surface 310 and a second PCB surface 312. Placed upon the first PCB surface 310 and positioned between each of the plurality of embedded power devices 202 may be a first portion of an electrical insulation layer 302, so that each of the plurality of embedded power devices 202 are electrically isolated from each other. The first portion of the electrical insulation layer 302 may be 3D printed between each of the plurality of embedded power devices 202, for example.

Figure 3B:
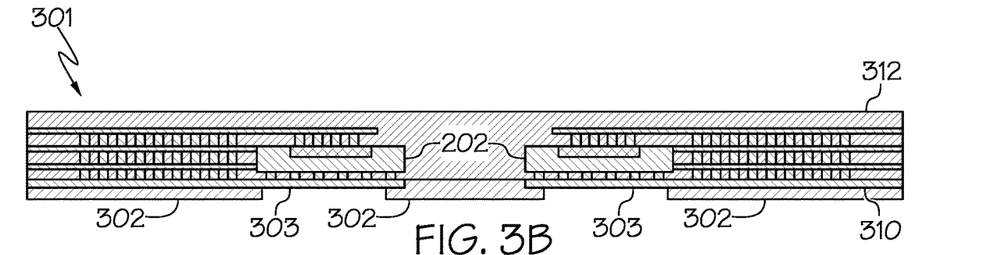

As depicted in FIG. 3B, a second portion of the electrical insulation layer 302 is placed upon the first PCB surface 310. In embodiments, the second portion of the electrical insulation layer 302 is 3D printed upon the first PCB surface 310 in the same process of 3D printing the first portion of the electrical insulation layer 302. During the placement of the second portion of the electrical insulation layer 302, a plurality of MIO cavities 303 are formed. In embodiments, the plurality of MIO cavities 303 extend to the first PCB surface 310, such that the first PCB surface 310 is exposed. The plurality of MIO cavities 303 may be placed upon a same cavity axis as each of the plurality of embedded power devices 202. This may be advantageous as it decreases a thermal path between the plurality of MIO cavities 303 and the plurality of embedded power devices 202. In embodiments, some or none of the plurality of MIO cavities 303 are placed upon the same cavity axis as each of the plurality of embedded power devices 202.

Figure 3C:
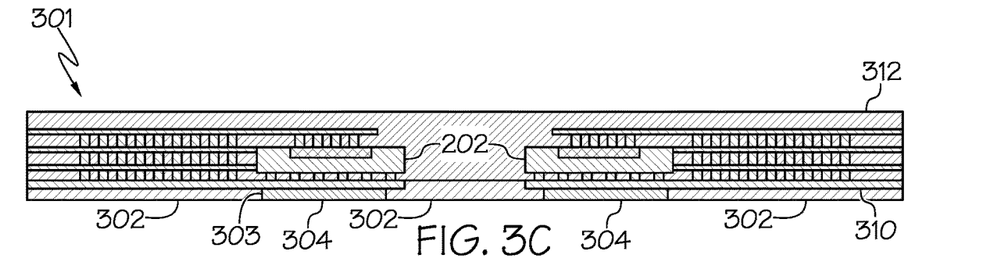

As depicted in FIG. 3C, a MIO template 304 is placed into each of the plurality of MIO cavities 303. As discussed in greater detail above, the MIO template 304 may be constructed of a sacrificial template. The sacrificial template may include, for example and not as a limitation, microspheres that are dissolved after metal deposition to leave a skeletal network of metal with a periodic arrangement of networked pores, which may or may not be etched to increase porosity and interconnection of the hollow spheres.

Figure 3D:
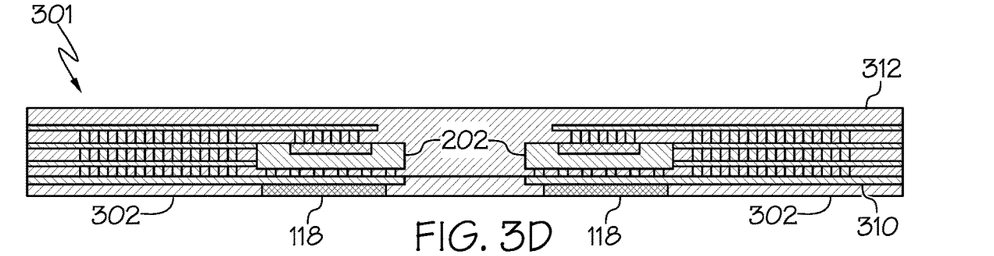

As depicted in FIG. 3D, a metal deposition is provided into the MIO template 304. The MIO template 304 may then be dissolved or otherwise removed (e.g., electroplating), leaving the skeletal network forming the plurality of MIO portions 118.

Figure 3E:
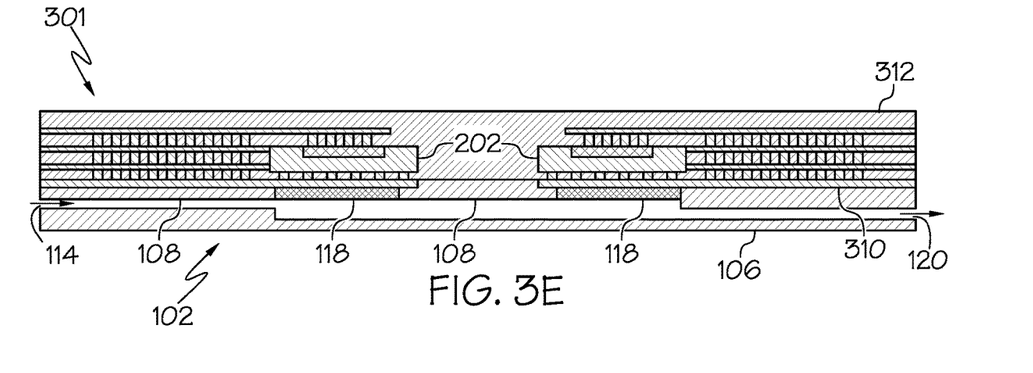

As depicted in FIG. 3E, the cold plate 102 is placed upon the PCB 301. In some embodiments, the cold plate 102 is placed directly upon the electrical insulation layer 302. In other embodiments, the cold plate 102 is 3D printed onto the PCB 301 and is formed (e.g., integrated) with the electrical insulation layer 302 in the same 3D printing process. In these embodiments, and as discussed in greater detail above, the cold plate 102 is formed of an electrically insulating material. Coolant may the cold plate 102 via the inlet 114. The coolant interfaces with a top surface of each of the plurality of MIO portions 118 in order to absorb heat from each of the plurality of MIO portions 118. The coolant may then exit the cold plate 102 via the outlet 120.

As depicted, the inlet 114 and the outlet 120 are aligned along a horizontal axis. However, other configurations are contemplated and possible. For example, the inlet 114 and/or the outlet may extend from the first surface 106 and through a portion of the cold plate 102. In another example, the inlet 114 may extend from the first surface 106 and through a portion of the cold plate 102 and more than one outlet 120 may be aligned along the horizontal axis. In yet another example, more than one inlet 114 may be aligned along the horizontal axis and the outlet 120 may extend from the first surface 106 and through a portion of the cold plate 102.

Figure 4A:
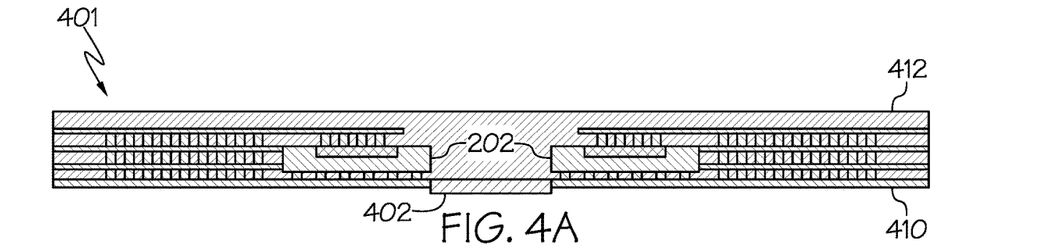
FIGS. 4A-4E schematically depicts a cross-sectional, side view of a power electronics assembly being fabricated by another method, according to one or more embodiments shown and described herein.

Referring now to FIGS. 4A-4E, an alternative approach for fabricating the power electronics assembly 100 is illustrated, according to varying embodiments. FIG. 4A illustrates a side, cross-sectional view of a PCB 401 having the plurality of embedded power devices 202 embedded between a first PCB surface 410 and a second PCB surface 412. Placed upon the first PCB surface 410 and positioned between each of the plurality of embedded power devices 202 may be a first portion of an electrical insulation layer 402, so that each of the plurality of embedded power devices 202 are electrically isolated from each other. The first portion of the electrical insulation layer 402 may be 3D printed between each of the plurality of embedded power devices 202, for example. In comparison to FIG. 3A, a height of the first portion of the electrical insulation layer 402 may be larger than a height of the first portion of the electrical insulation layer 302.

Figure 4B:
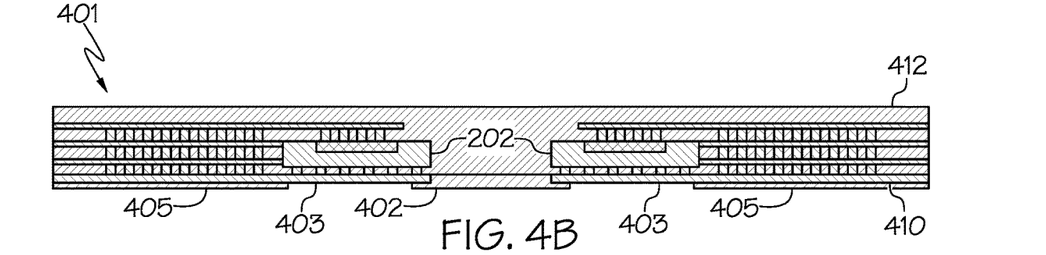

As depicted in FIG. 4B, a second portion of the electrical insulation layer 402 is placed upon the first PCB surface 410. In embodiments, the second portion of the electrical insulation layer 402 is 3D printed upon the first PCB surface 110 in the same process of 3D printing the first portion of the electrical insulation layer 302. In comparison to FIG. 3B, a height of the second portion of the electrical insulation layer 402 may be less than a height of the second portion of the electrical insulation layer 302. During the forming of the second portion of the electrical insulation layer 402, a plurality of MIO cavities 403 are formed. In embodiments, the plurality of MIO cavities 403 extend to the first PCB surface 410, such that the first PCB surface 110 is exposed. The plurality of MIO cavities 403 may be placed upon a same cavity axis as each of the plurality of embedded power devices 202. This may be advantageous as it decreases a thermal path between the plurality of MIO cavities 403 and the plurality of embedded power devices 202. In embodiments, some or none of the plurality of MIO cavities 403 are placed upon the same cavity axis as each of the plurality of embedded power devices 202.

Figure 4C:
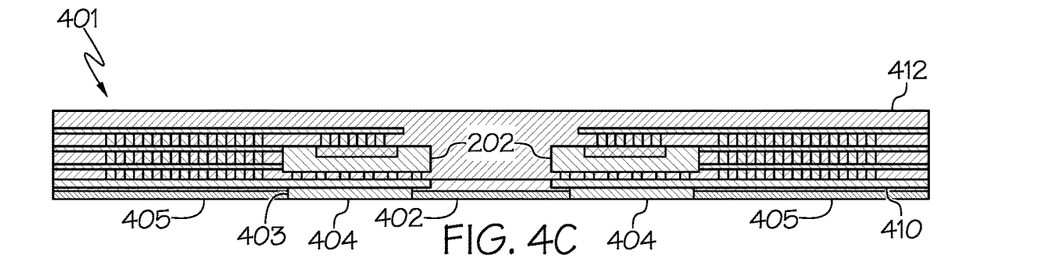

As depicted in FIG. 4C, a template frame 405 is temporarily placed upon and/or coupled to the PCB 401. The template frame 405 defines a plurality of apertures that align with each of the plurality of MIO cavities 403. In this way, each of the plurality of MIO cavities 403 and each of the plurality of apertures of the template frame 405 define an increased cavity height. This is advantageous as it facilitates for the plurality of MIO portions 118 to define a larger height after being formed. A MIO template 404 may then be placed into each of the plurality of MIO cavities 403 and the apertures of the template frame 405. As discussed in greater detail above, the MIO template 404 may be constructed of a sacrificial template. The sacrificial template may include, for example and not as a limitation, microspheres that are dissolved after metal deposition to leave a skeletal network of metal with a periodic arrangement of networked pores, which may or may not be etched to increase porosity and interconnection of the hollow spheres.

Figure 4D:
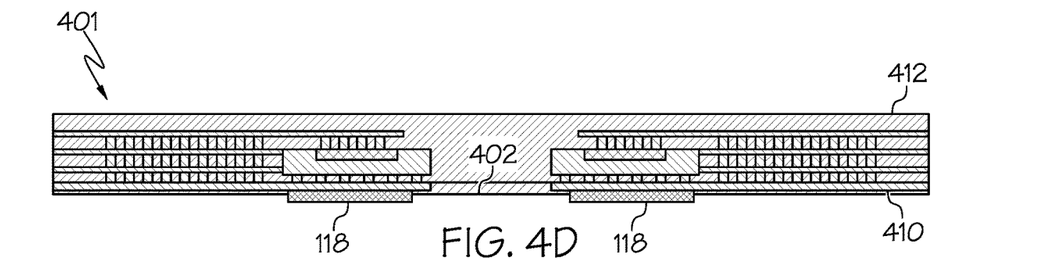

As depicted in FIG. 4D, a metal deposition is provided into the MIO template 404. The MIO template 404 may then be dissolved or otherwise removed (e.g., electroplating), leaving the skeletal network forming the plurality of MIO portions 118. Accordingly, the template frame 405 may be removed after the plurality of MIO portions 118 have been formed. As compared to FIG. 3D, a height of each of the plurality of MIO portions 118 may be larger.

Figure 4E:
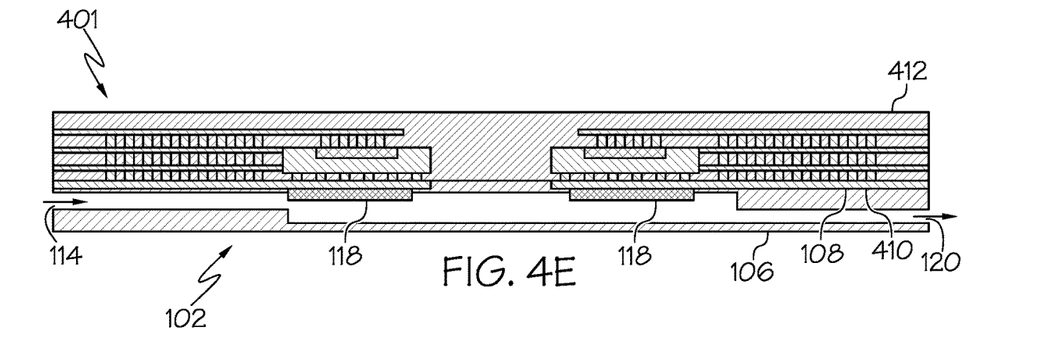

As depicted in FIG. 4E, the cold plate 102 is placed upon the PCB 401. In some embodiments, the cold plate 102 is placed directly upon the electrical insulation layer 402. In other embodiments, the cold plate 102 is 3D printed onto the PCB 104 and is formed (e.g., integrated) with the electrical insulation layer 402 in the same 3D printing process. In these embodiments, and as discussed in greater detail above, the cold plate 102 is formed of an electrically insulating material. Coolant may then the cold plate 102 via the inlet 114.

Figure 5:
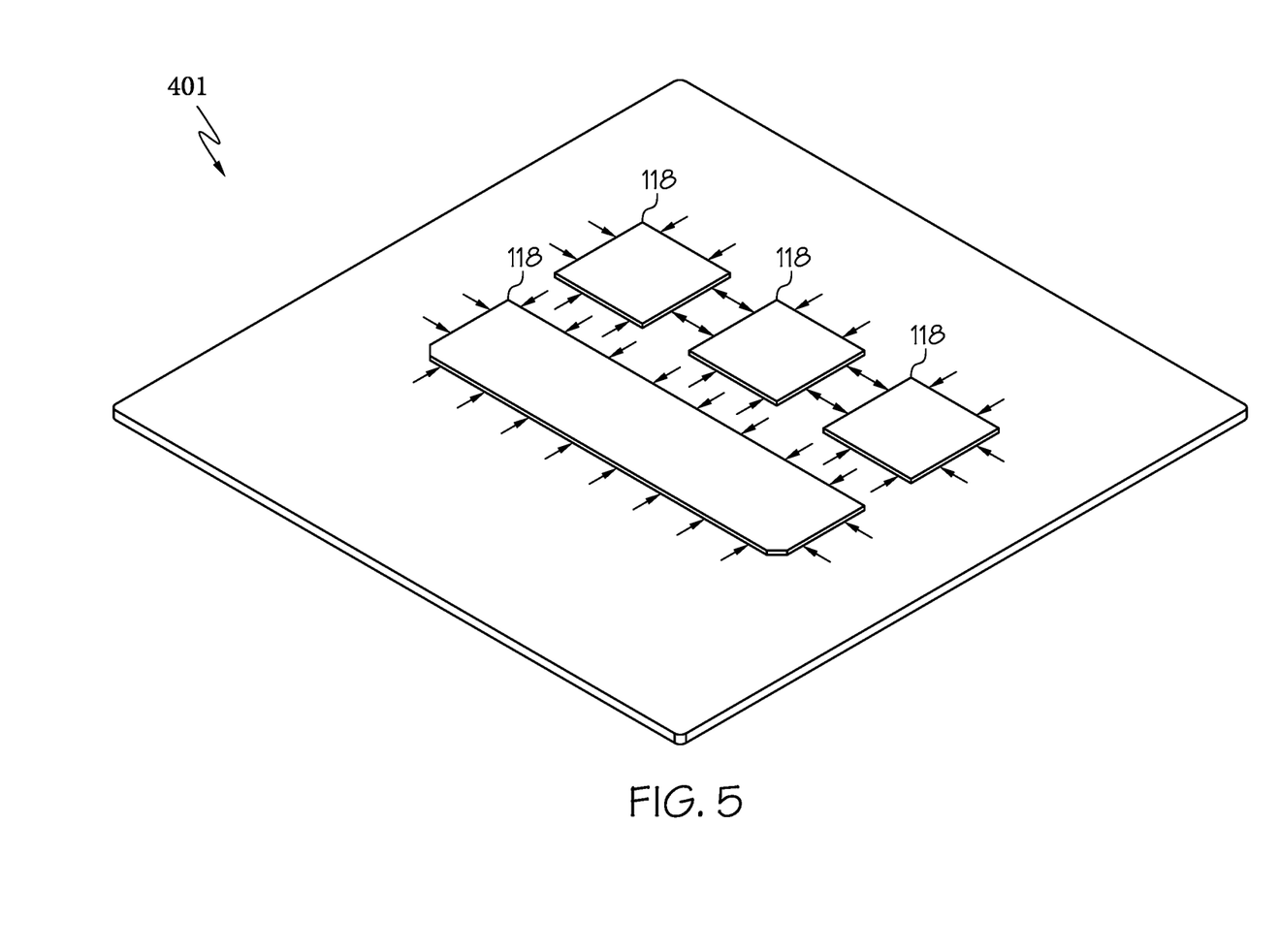
FIG. 5 schematically depicts a perspective view of a PCB with select parts omitted, according to one or more embodiments shown and described herein.

FIG. 5 depicts a perspective view of the PCB 401 with the plurality of MIO portions 118 formed through the approach detailed in FIGS. 4A-4E. As shown, the plurality of MIO portions 118 protrude from the first PCB surface 110. The coolant may then interface with exposed side surfaces and a top surface of each of the plurality of MIO portions 118 to absorb heat from each of the plurality of MIO portions 118. By exposing more of a surface area of each of the plurality of MIO portions 118, the power electronics assembly 100 may have even more enhanced cooling of the plurality of embedded power devices 202.

Referring back to FIG. 4E, after interfacing with the plurality of MIO portions 118, the coolant may then exit the cold plate 102 via the outlet 120. As discussed in greater detail above, the inlet 114 and the outlet 120 may be positioned in varying configurations in order to increase a cooling rate of the power electronics assembly 100 and/or for achieving a desired packaging profile.

Figure 6:
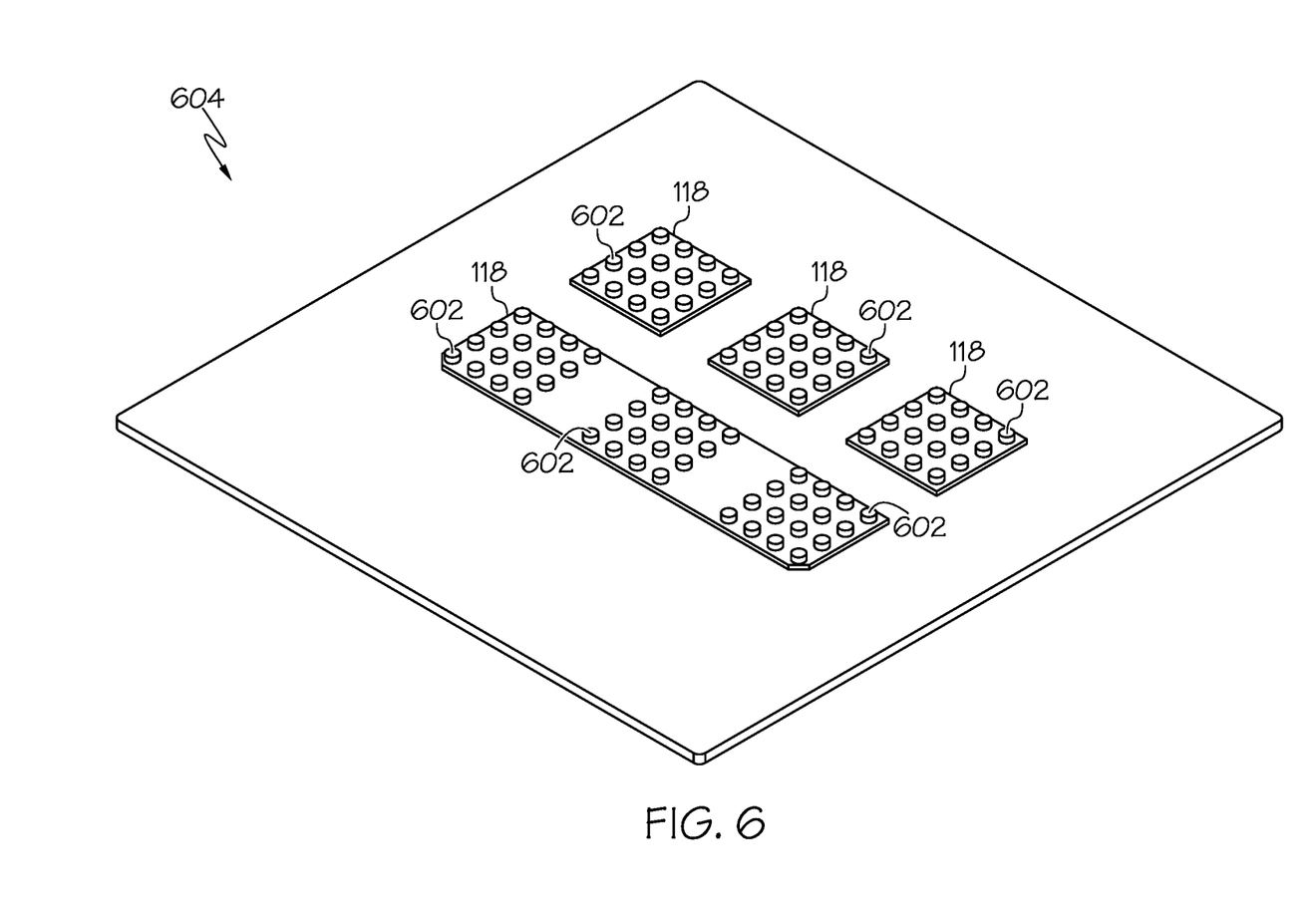
FIG. 6 schematically depicts a perspective view of a PCB with select parts omitted, according to one or more embodiments shown and described herein.

FIG. 6 depicts a perspective view of a PCB 604 with the plurality of MIO portions 118 with selected parts omitted, according to another embodiment. In these embodiments, each of the plurality of MIO portions 118 include a plurality of pin fins 602. The plurality of pin fins 602 define additional surface area for the plurality of MIO portions 118 to the coolant, in order to enhance the cooling rate of each of the plurality of MIO portions 118. As depicted, the plurality of pin fins 602 extend from the top surface of the plurality of MIO portions 118, but may also extend from side walls of the plurality of MIO portions 118. In embodiments, the plurality of pin fins 602 are 3D printed or formed upon the plurality of MIO portions 118 after forming the plurality of MIO portions 118. In embodiments, the plurality of pin fins 602 are 3D printed or formed upon the plurality of MIO portions 118, while forming the plurality of MIO portions 118. In some embodiments, the plurality of pin fins 602 are coated with an MIO coating to further increase the cooling efficiency of the plurality of MIO portions 118.

Figure 7:
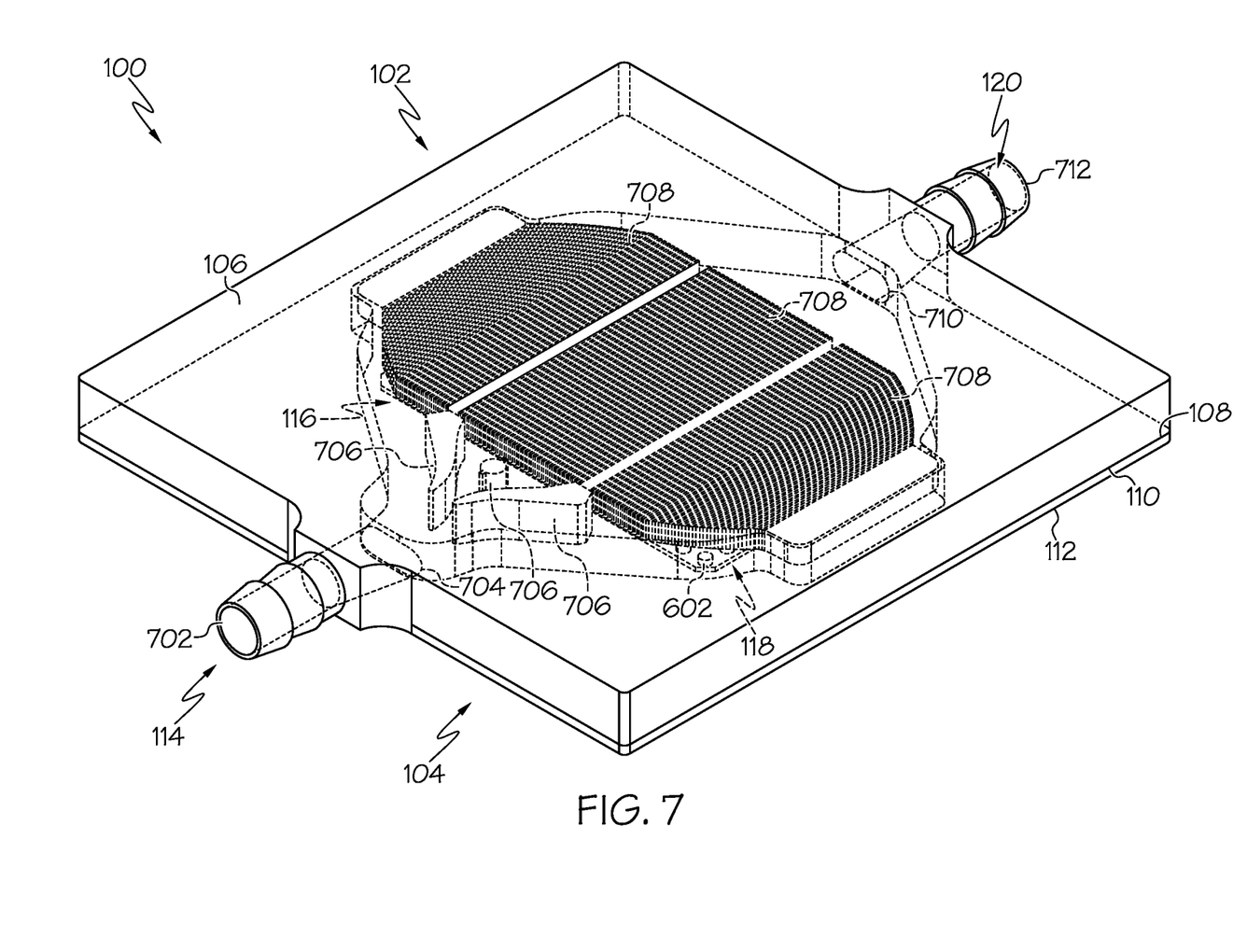
FIG. 7 schematically depicts a perspective view of another power electronics assembly, according to one or more embodiments shown and described herein.

Referring now to FIG. 7, a perspective view of the power electronics assembly 100 is shown, according to varying embodiments. The inlet 114 of the cold plate 102 includes an inlet opening 702 and a manifold inlet 704. The inlet 114 receives coolant via the inlet opening 702. As depicted the inlet opening 702 defines a circular shape, however, other geometries (e.g., oval shape, rectangular shape) are contemplated and possible. The inlet 114 provides the coolant to the manifold 116 via the manifold inlet 704. As depicted the manifold inlet 704 defines an oval shape, however, other geometries (e.g., circular shape, rectangular shape) are contemplated and possible.

The example manifold 116 includes a plurality of flow distributors 706. The plurality of flow distributors 706 extend from the manifold 116 and are further positioned between the inlet 114 and the outlet 120. Each of the plurality of flow distributors 706 co-operate to direct a coolant flow to predetermined areas of the manifold 116. This is advantageous as the coolant may be directed to areas of the manifold 116 requiring increased cooling. For example, additional coolant may be directed to flow directly beneath one of the plurality of embedded power devices 202 operating at a higher voltage relative to other embedded power devices 202. In this way, there may be an overall improved cooling rate from the plurality of embedded power devices 202 to the coolant within the manifold 116.

As depicted, the plurality of flow distributors 706 define three flow distributors. However, there may be any number of flow distributors in the plurality of flow distributors 706. As depicted, the plurality of flow distributors 706 are adjacent to the inlet 132. However, the plurality of flow distributors 706 may be positioned at an equitant distance between the inlet 114 and the outlet 120 or may be positioned adjacent to the outlet 120. In embodiments, there are multiple sets of the plurality of flow distributors 706, each positioned at varying points within the manifold 116.

The outlet 120 includes a manifold outlet 710 and an outlet opening 712. After receiving heat from the manifold 116, the coolant may exit the manifold 116 via the manifold outlet 710. As depicted the manifold outlet 710 defines an oval shape, however, other geometries (e.g., circular shape, rectangular shape) are contemplated and possible. The coolant may then be provided to a downstream component (not shown) via the outlet opening 712.

The cold plate 102 may further include a plurality of channels 708. The plurality of channels 708 extend along a width of the cold plate 102 and may interface with the coolant within the manifold 116. The plurality of flow distributors 706 may co-operate with the plurality of channels 708 to enhance the cooling capacity of the cold plate 102. For example, after coolant enters the manifold 116, each of the plurality of flow distributors 706 may distribute the coolant to a respective set of the plurality of channels 708. In this way, the flow path of the coolant may be further controlled to enhance the cooling capabilities of the cold plate 102. In embodiments, the plurality of channels 708 are formed through 3D printing.

From the above, it is to be appreciated that defined herein are embodiments described herein are directed to a power electronics assemblies that include a printed circuit board (PCB) having a plurality of embedded power devices, as well as a cold plate in contact with the PCB. The PCB includes a plurality of metal inverse opal (MIO) portions that are thermally coupled to the plurality of embedded power devices. The MIO portions may provide improved cooling of the plurality of embedded power devices. This may result in an increased power output of the plurality of embedded power devices and an improved power density of the power electronics assemblies. The power electronic assemblies may include a cold plate thermally coupled to the plurality of MIO portions. The cold plate may include pin fins to improve the cooling rate of the power electronics assemblies. The pin fins may be coated with MIO to further improve the cooling rate of the power electronics assemblies.

The cold plate may receive dielectric coolant to electrically insulate each of the plurality of MIO portions, thereby avoiding or minimizing the need for electrical insulation layers and/or reduce overall thermal resistance. Due to the decreased thermal resistance, the cooling process is more efficient, thereby allowing for the cold plate to be thinner, which results in an overall compact package size that offers improved cooling capabilities. In embodiments, the power electronics assemblies described herein can be integrated into other cooling systems that also utilize dielectric coolants, such as a motor cooling system (e.g., in-wheel motor) or the like.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed is:

1. A power electronics assembly comprising:
   a printed circuit board (PCB) comprising:
      a plurality of embedded power devices; and
      a substrate layer comprising a plurality of metal inverse opal (MIO) portions; and
   an electrically insulating portion disposed between each of the plurality of MIO portions, the plurality of MIO portions being thermally coupled to the plurality of embedded power devices.

2. The power electronics assembly of claim 1, further comprising a cold plate in thermal communication with the plurality of MIO portions.

3. The power electronics assembly of claim 2, wherein the cold plate is in contact with the PCB, and wherein the cold plate includes an inlet for dielectric coolant, the dielectric coolant electrically insulating each of the plurality of MIO portions.

4. The power electronics assembly of claim 2, further comprising an electrical insulation layer disposed between the PCB and the cold plate.

5. The power electronics assembly of claim 2, wherein the cold plate comprises a plurality of channels disposed between an inlet and an outlet of the cold plate, the plurality of channels configured to direct coolant within the cold plate.

6. The power electronics assembly of claim 2, further comprising a second PCB in contact with the cold plate and in thermal communication with the cold plate.

7. The power electronics assembly of claim 2, further comprising a capacitor pack in contact with the cold plate and in thermal communication with the cold plate.

8. The power electronics assembly of claim 1, wherein each of the plurality of MIO portions further comprises a plurality of pin fins, the plurality of pin fins extending away from a top surface of each of the plurality of MIO portions, the plurality of pin fins partially coated with an MIO coating.

9. A method for fabricating a power electronics assembly, the method comprising:
   forming an electrical insulation layer on a substrate layer of a printed circuit board (PCB), the electrical insulation layer defining a plurality of cavities;
   depositing a metal inverse material (MIO) template into each of the plurality of cavities;
   depositing MIO material into each MIO template; and
   removing the MIO templates, thereby forming a plurality of MIO portions, each being thermally coupled to an embedded device of a plurality of embedded devices of the PCB.

10. The method of claim 9, wherein each of the plurality of embedded devices share an axis with a cavity of the plurality of cavities.

11. The method of claim 9, further comprising forming a plurality of pin fins, the plurality of pin fins extending away from a top surface of each of the plurality of MIO portions, the plurality of pin fins partially coated with an MIO coating.

12. The method of claim 9, further comprising printing a cold plate onto the substrate layer of the PCB, the cold plate being in thermal communication with the plurality of MIO portions.

13. The method of claim 12, further comprises printing a plurality of channels in the cold plate, the plurality of channels disposed between an inlet and an outlet of the cold plate and configured to direct coolant within the cold plate.

14. The method of claim 12, further comprising placing a second PCB in contact with the cold plate, the second PCB being in thermal communication with the cold plate.

15. The method of claim 12, further comprising placing a capacitor pack in contact with the cold plate, the capacitor pack being in thermal communication with the cold plate.

16. A method for fabricating a power electronics assembly, the method comprising:
   forming an electrical insulation layer having a plurality of cavities onto a printed circuit board (PCB);
   placing a frame onto the PCB;
   depositing a metal inverse material (MIO) template into each of the plurality of cavities;
   depositing MIO material into the MIO template; and
   removing the frame and the MIO template, thereby forming a plurality of MIO portions, each being thermally coupled to an embedded device of a plurality of embedded devices of the PCB.

17. The method of claim 16, wherein:
   the PCB defines a first PCB surface;
   the plurality of MIO portions each define a top surface, and
   the top surface of the plurality of MIO portions extends away from the first PCB surface.

18. The method of claim 16, wherein the frame comprises a plurality of frame cavities substantially sized and disposed along a same cavity axis as each of the plurality of cavities.

19. The method of claim 18, wherein the embedded device of the plurality of embedded devices is centered upon the cavity axis.

20. The method of claim 16, further comprising forming a plurality of pin fins, the plurality of pin fins extending away from a top surface of each of the plurality of MIO portions, the plurality of pin fins partially coated with an MIO coating.

* * * * *